US012564004B2

(12) United States Patent
Dao et al.

(10) Patent No.: US 12,564,004 B2
(45) Date of Patent: Feb. 24, 2026

(54) METHODS, SYSTEMS, AND APPARATUS FOR MEASURING A GAP BETWEEN A SUPPORT SURFACE FOR A SUBSTRATE AND AN OPPOSING UPPER SURFACE OF A PROCESSING CHAMBER

(71) Applicant: Applied Materials, Inc., Santa Clara, CA (US)

(72) Inventors: Trung H. Dao, San Jose, CA (US); Sagir Bipin Kadiwala, Santa Clara, CA (US); Sam Kim, San Jose, CA (US); Minh Quoc Tran, Gilroy, CA (US); Gu Liu, Santa Clara, CA (US)

(73) Assignee: Applied Materials Inc., Santa Clara, CA (US)

( * ) Notice: Subject to any disclaimer, the term of this patent is extended or adjusted under 35 U.S.C. 154(b) by 147 days.

(21) Appl. No.: 18/223,690

(22) Filed: Jul. 19, 2023

(65) Prior Publication Data

US 2025/0029862 A1 Jan. 23, 2025

(51) Int. Cl.
| | |
|---|---|
| *G06T 7/00* | (2017.01) |
| *B25J 9/16* | (2006.01) |
| *G01B 11/14* | (2006.01) |
| *G06T 7/80* | (2017.01) |
| *H01L 21/68* | (2006.01) |

(52) U.S. Cl.
CPC ............ *H01L 21/68* (2013.01); *B25J 9/1692* (2013.01); *G01B 11/14* (2013.01); *G06T 7/80* (2017.01); *G06T 2207/30148* (2013.01)

(58) Field of Classification Search
CPC . H01L 21/68; H01L 21/67259; H01L 21/681; B25J 9/1692; G01B 11/14; G01B 7/044; G06T 7/80; G06T 2207/30148; G06T 7/0004; G06T 7/60

USPC .... 73/1.79, 1.81, 1.75, 865.8, 104; 324/661, 324/662; 33/1 N, 1 PT, 700, 701
See application file for complete search history.

(56) References Cited

U.S. PATENT DOCUMENTS

| | | | |
|---|---|---|---|
| 5,444,637 | A | 8/1995 | Smesny et al. |
| 10,522,380 | B2 | 12/2019 | Potter, Sr. |
| 10,794,681 | B2 | 10/2020 | Potter et al. |
| 11,387,122 | B2 | 7/2022 | Potter et al. |
| 11,404,296 | B2 | 8/2022 | Potter et al. |

(Continued)

OTHER PUBLICATIONS

International Search Report for PCT/US2024/037333, dated Oct. 22. 2024.

*Primary Examiner* — Robert R Raevis
(74) *Attorney, Agent, or Firm* — Moser Taboada

(57) ABSTRACT

Methods, systems, and apparatus for measuring a gap between a support surface for a substrate and an opposing upper surface of a processing chamber. The methods comprise: disposing a sensor substrate at a location spaced between the support surface and the upper surface, the sensor substrate comprising a body having a first side and a second side opposite the first side, the first side facing the support surface and the second side facing the upper surface, the first side having a first sensor and the second side having a second sensor; measuring, using the first sensor, a first distance between the first side and the support surface; measuring, using the second sensor, a second distance between the second side and the upper surface; and determining a gap between the support surface and the upper surface using the first distance and the second distance.

13 Claims, 6 Drawing Sheets

(56) References Cited

U.S. PATENT DOCUMENTS

| | | | |
|---|---|---|---|
| 11,430,680 B2 | 8/2022 | Ravid et al. | |
| 2006/0157698 A1 | 7/2006 | Miyajima | |
| 2017/0350688 A1 | 12/2017 | Boyd et al. | |
| 2020/0072594 A1 | 3/2020 | Potter et al. | |
| 2020/0075368 A1 | 3/2020 | Potter | |
| 2021/0378100 A1 | 12/2021 | Criminale et al. | |
| 2022/0254666 A1 | 8/2022 | Sadeghi et al. | |
| 2024/0353217 A1* | 10/2024 | Hiester | C23C 16/507 |

* cited by examiner

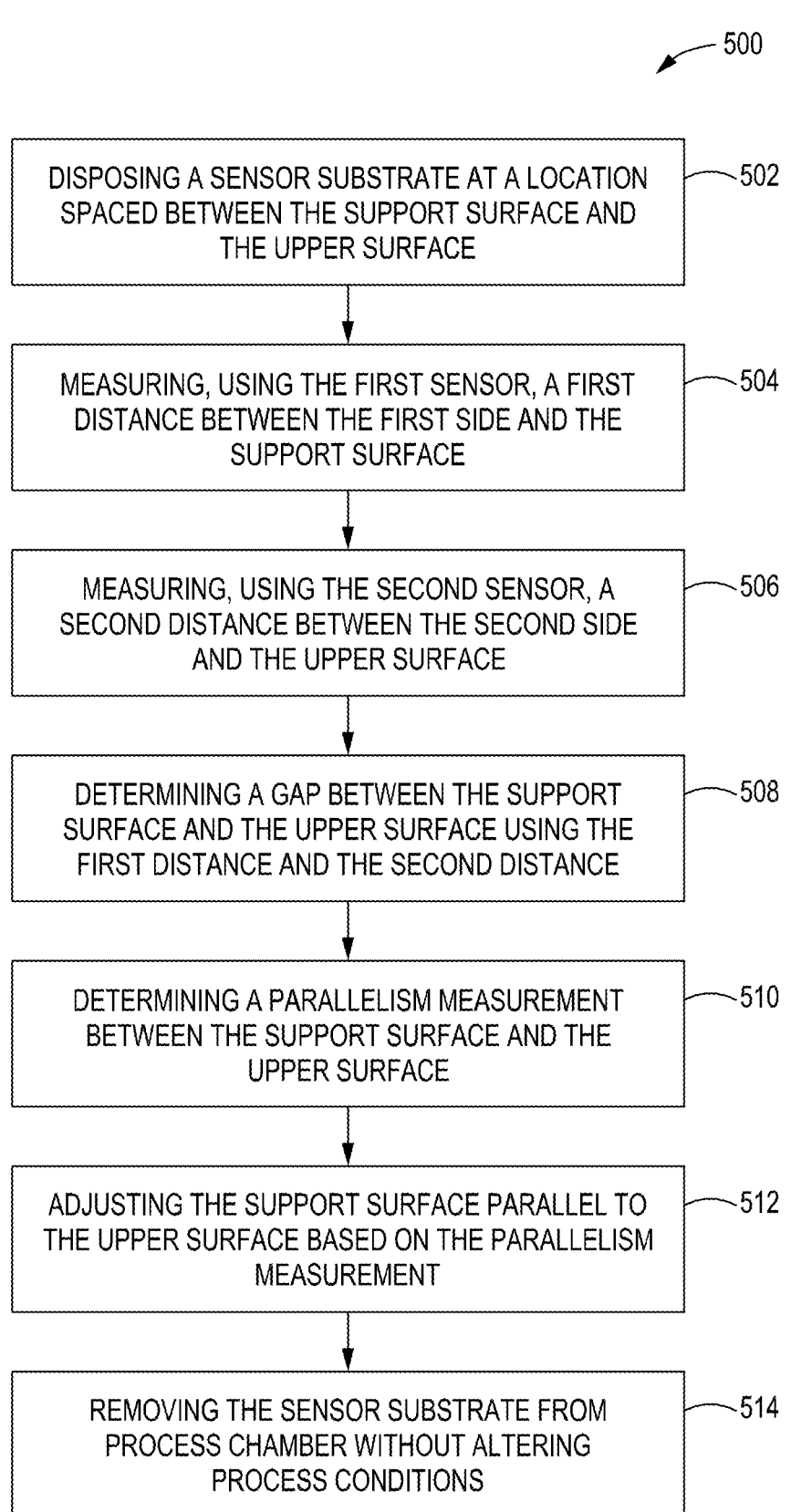

502 — DISPOSING A SENSOR SUBSTRATE AT A LOCATION SPACED BETWEEN THE SUPPORT SURFACE AND THE UPPER SURFACE

504 — MEASURING, USING THE FIRST SENSOR, A FIRST DISTANCE BETWEEN THE FIRST SIDE AND THE SUPPORT SURFACE

506 — MEASURING, USING THE SECOND SENSOR, A SECOND DISTANCE BETWEEN THE SECOND SIDE AND THE UPPER SURFACE

508 — DETERMINING A GAP BETWEEN THE SUPPORT SURFACE AND THE UPPER SURFACE USING THE FIRST DISTANCE AND THE SECOND DISTANCE

510 — DETERMINING A PARALLELISM MEASUREMENT BETWEEN THE SUPPORT SURFACE AND THE UPPER SURFACE

512 — ADJUSTING THE SUPPORT SURFACE PARALLEL TO THE UPPER SURFACE BASED ON THE PARALLELISM MEASUREMENT

514 — REMOVING THE SENSOR SUBSTRATE FROM PROCESS CHAMBER WITHOUT ALTERING PROCESS CONDITIONS

METHODS, SYSTEMS, AND APPARATUS FOR MEASURING A GAP BETWEEN A SUPPORT SURFACE FOR A SUBSTRATE AND AN OPPOSING UPPER SURFACE OF A PROCESSING CHAMBER

FIELD

Embodiments of the present disclosure generally relate to semiconductor manufacturing, and, more particularly, to methods, systems, and apparatus for measuring gaps in semiconductor manufacturing environments.

BACKGROUND

In semiconductor manufacturing, process uniformity over a substrate may be desirable to provide high yields. In substrate deposition processes, such as plasma processing, factors that can affect process uniformity include gap spacing and parallelism between the substrate and structures of the processing chamber facing the substrate, such as showerhead or sputtering target. Some currently available gap measurement tools sit on the substrate support while taking measurements for gap and parallelism.

Some measurement tools are limited in their environmental operating range and cannot operate at processing conditions so that some processing chambers are vented prior to introducing gap measurement tools into the processing chambers to perform measurements. Accordingly, equipment down-time for calibration is increased. Additionally, the measurements may not be accurate if the chamber is vented and cooled after calibration and then pumped back down after removal of the measurement tools.

Thus, the inventors propose methods, systems, and apparatus that provide accurate gap and parallelism measurements obtained at process conditions and without contacting the substrate support to improve calibration accuracy, as well as substrate processing throughput and yield.

SUMMARY

Methods, systems, and apparatus for measuring a gap between a support surface for a substrate and an opposing upper surface of a processing chamber, are provided herein. In some embodiments, a method for measuring a gap between a support surface for a substrate and an opposing upper surface of a processing chamber, the method comprising: disposing a sensor substrate at a location spaced between the support surface and the upper surface, the sensor substrate comprising a body having a first side and a second side opposite the first side, the first side facing the support surface and the second side facing the upper surface, the first side having a first sensor and the second side having a second sensor; measuring, using the first sensor, a first distance between the first side and the support surface; measuring, using the second sensor, a second distance between the second side and the upper surface; and determining a gap between the support surface and the upper surface using the first distance and the second distance.

In some embodiments, a method for calibrating a robot blade in a processing chamber having a support surface for a substrate, the method comprising: supporting a sensor substrate with the robot blade at a handoff position spaced from the support surface, the sensor substrate having an image capture device at a center of the sensor substrate; capturing an image that includes a portion of the support surface having an alignment feature, and a calibration feature of the image capture device; determining from the captured image whether there is a misalignment between the alignment feature and the calibration feature; and if there is a misalignment, calibrating the handoff position of the robot blade based on an amount of the misalignment.

In some embodiments, a sensor substrate, comprises: a body having a first side and a second side opposite the first side; a first sensor on the first side and configured for measuring distance; a second sensor on the second side and configured for measuring distance; and an image capture device located at a center of the sensor substrate.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

FIG. 5 shows a method in accordance with some embodiments of the present disclosure.

Figures 1, 2, 3, 4:
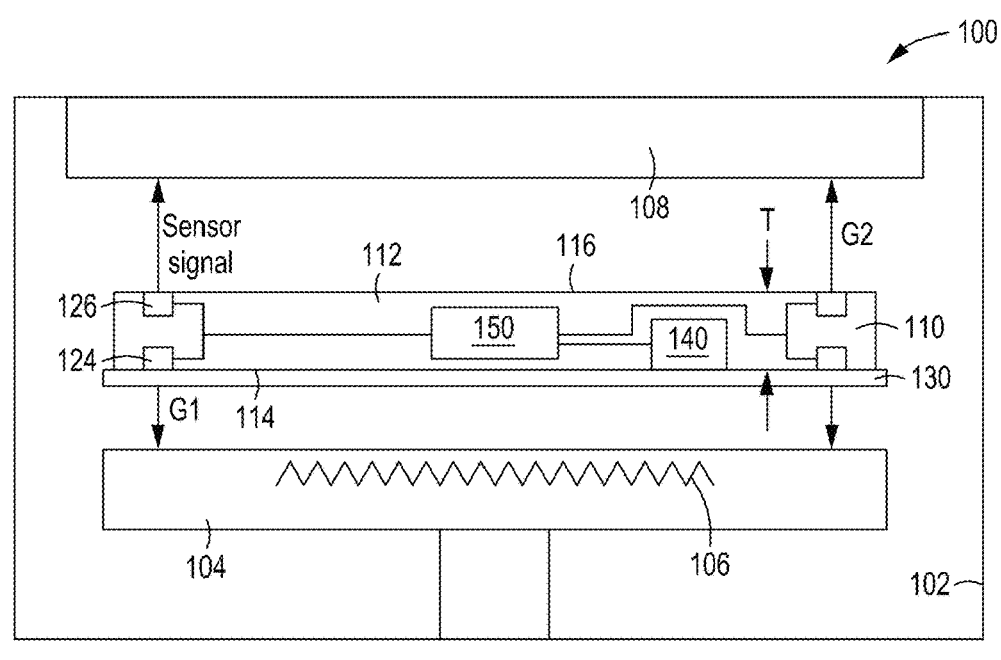
FIG. 1 depicts a schematic of processing tool in accordance with some embodiments of the present disclosure.
FIG. 2 is a bottom view of a sensor substrate in accordance with some embodiments of the present disclosure.
FIG. 3 is a top view of the sensor substrate shown in FIG. 2.
FIG. 4 shows the sensor substrate in FIG. 2 supported by a robot blade in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of a method, system, and apparatus are provided for measuring a gap between a support surface for a substrate and an opposing upper surface of a processing chamber. In the following description, numerous specific details are set forth in order to provide a thorough understanding of embodiments. However, one skilled in the art would appreciate that embodiments may be practiced without these specific details. In other instances, well-known aspects are not described in detail in order to not unnecessarily obscure embodiments. Furthermore, the various embodiments shown in the accompanying drawings are illustrative representations and are not necessarily drawn to scale.

The inventors have found that gap and parallelism measurements taken at conditions other than actual processing conditions, may lead to inaccurate calibrations and that measurement tool contact with the substrate support may cause damage to the substrate support (e.g., heaters) that may not be noticed until substrate processing commences. Accordingly, embodiments disclosed herein utilize a sensor substrate with sensors that can operate in processing chambers at process conditions and without contacting a substrate support. By using a sensor substrate in accordance with embodiments of the present disclosure, the sensor substrate can implement measurements at process conditions in a processing chamber without altering the temperature and pressure of a processing chamber before loading or removing the sensor substrate from the processing chamber. Therefore, embodiments disclosed herein allow for shorter calibration times, more accurate calibrations, and increased throughput capacity of the processing chamber. Also, by using a sensor substrate in accordance with embodiments of the present disclosure, by avoiding contact between the sensor substrate and the substrate support, damage to substrate support due to calibration can be reduced or eliminated.

Referring now to FIG. 1, a cross-sectional illustration of a processing tool 100 is shown in accordance with some embodiments. In some embodiments, and as shown in FIG. 1, the processing tool 100 may comprise a processing chamber 102 (e.g., a PVD or CVD chamber). A vacuum pump (not shown) may be fluidically coupled to the processing chamber 102 to provide a less than atmospheric pressure within the processing chamber 102 during operation. In some embodiments, and as shown in FIG. 1, the processing tool 100 may comprise a support surface 104 for supporting substrates in the processing chamber 102. The support surface 104 may be an electrostatic chuck (ESC) or any other suitable surface for securing and supporting substrates. In some embodiments, the support surface 104 may include a heating element 106 for heating a substrate supported by the support surface 104.

In some embodiments, and as shown in FIG. 1, the processing chamber 102 may have an upper surface 108 that opposes the support surface 104. In some embodiments, the upper surface 108 may include or be part of a showerhead (also referred to as a gas distribution plate). One or more process gases may be introduced into the processing chamber 102 through the showerhead. The showerhead may also function as an electrode in the processing tool 100. In some embodiments, the upper surface 108 may include or be a part of a sputtering target.

While several particular components of the processing tool 100 are explicitly shown in FIG. 1, any number of additional components common to processing tools in the semiconductor manufacturing field may also be included in the processing tool 100, as those skilled in the art will recognize. In some embodiments, the processing tool 100 may be a plasma processing tool (e.g., a plasma etch tool, a physical vapor deposition (PVD) tool, a plasma enhanced chemical vapor deposition (PE-CVD) tool, a plasma enhanced atomic layer deposition (PE-ALD) tool, or the like). Embodiments may also include processing tools 100 that are not plasma-based tools (e.g., CVD, ALD, furnaces, etc.).

In some embodiments, and as shown in FIG. 1, the distance or gap between the support surface 104 and the upper surface 108 may be measured with a sensor substrate 110. In some embodiments, and as shown in FIG. 1, the sensor substrate 110 may comprise a body 112 having a first side 114 that opposes the support surface 104 and having a second side 116 that opposes the upper surface 108. In some embodiments, the sensor substrate 110 may have overall shape and dimensions similar to a semiconductor wafer or a substrate supported by the support surface 104. In some embodiments, the sensor substrate may be a wafer or other common substrate form (glass panels or the like). In some embodiments where the sensor substrate 110 is a wafer or other common substrate form may be advantageous for allowing handling of the sensor substrate 110 using existing substrate handling equipment without modification.

In some embodiments and as shown in FIG. 1, the sensor substrate 110 may have a first sensor 124 on the first side for measuring a first distance, such as a first gap G1, between the first side 114 and the support surface 104. In some embodiments, and as shown in FIG. 1, the sensor substrate 110 may have a second sensor 126 on the second side 116 for measuring a second distance, such as a second gap G2, between the second side 116 and the upper surface 108. In some embodiments, at least one of the first sensor 124 or the second sensor 126 may be a capacitive sensor capable of measuring distances up to 600 mm while operating under substrate processing conditions. In some embodiments, at least one of the first sensor 124 or the second sensor 126 may be flush, recessed, embedded in, or extend from the body 112.

In some embodiments, and as shown in FIG. 1, the sensor substrate 110 may measure the first gap G1 and the second gap G2 while being positioned at a handoff position of a robot blade 130 that supports the sensor substrate 110. In some embodiments, and as shown in FIG. 4, when the sensor substrate 110 is supported by the robot blade 130, the first sensors 124 are not covered by the robot blade 130 and have a line of sight to the support surface 104. In the handoff position, the sensor substrate 110 is supported by the robot blade 130 and the sensor substrate 110 is at a location spaced between the upper surface 108 and the support surface 104. Thus, in the handoff position, the sensor substrate 110 is located at a position spaced above the support surface 104 and spaced below the upper surface 108. In some embodiments, in the handoff position, a majority of the sensor substrate 110 is located directly above the support surface 104. In some embodiments, when disposed at the handoff position, the first sensor 124 may be located less than 600 mm from the support surface 104 and the second sensor 126 may be located less than 600 mm from the upper surface 108.

Since a thickness T of the sensor substrate 110 is known, a total gap distance between the upper surface 108 and the support surface 104 may be accurately measured using the first gap G1, the second gap G2, and thickness T. Furthermore, in some embodiments, and as shown in FIG. 1, where a plurality of first sensors 124 and a plurality of second sensors 126 are included with the sensor substrate 110, a plurality of first gap G1 readings and a plurality of second gap G2 reading may be obtained across the sensor substrate 110. By providing a plurality of gap readings across the sensor substrate 110, a parallelism measurement between the upper surface 108 and the support surface 104 may be made in accordance with some embodiments.

In some embodiments, and as shown in FIGS. 2 and 4, the sensor substrate 110 may include a plurality of first sensors 124 on the first side 114 and the first sensors 124 may be spaced equidistantly from a central axis A of the sensor substrate 110. In some embodiments, and a shown in FIG. 3, the sensor substrate 110 may include a plurality of second sensors 126 on the second side 116 and the second sensors 126 may be spaced equidistantly from the central axis A of the sensor substrate 110. In some embodiments, and as shown in FIGS. 1-4, each first sensor 124 may be located opposite (e.g., axially) a corresponding second sensor 126.

Figure 7A:
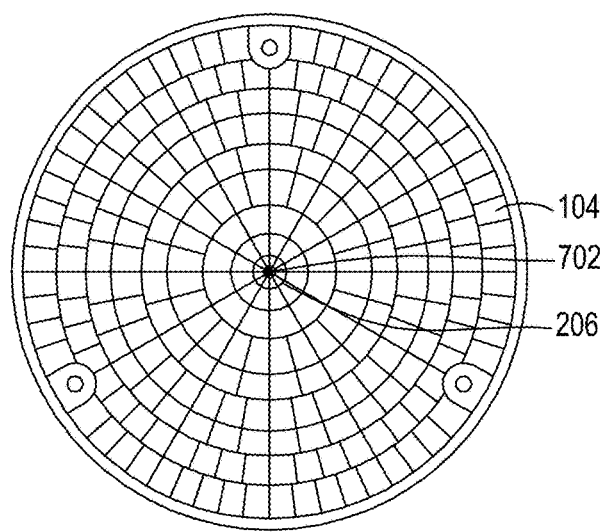
FIGS. 7A-7C show images captured by an image capture device of a sensor substrate in accordance with embodiments of the present disclosure.
Figure 7B:
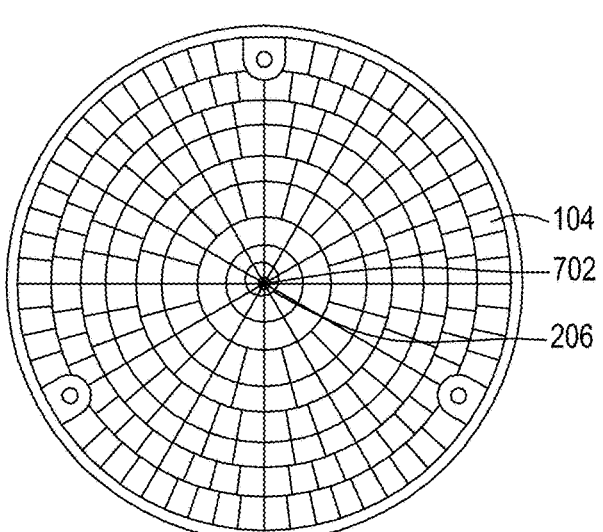
Figure 7C:
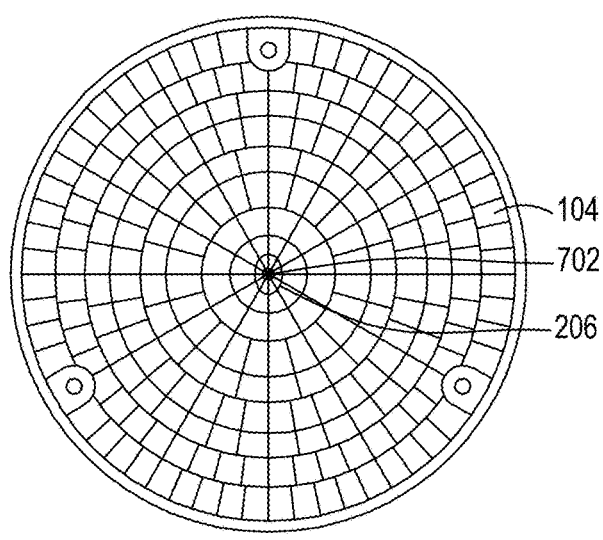

In some embodiments, and as shown in FIGS. 2 and 4, the sensor substrate 110 may include an image capture device 202 located at a center of the sensor substrate (centered with respect to axis A). In some embodiments, and as shown in FIGS. 2 and 4, the image capture device 202 may be located on the first side 114 of the body 112 to face the support surface 104. The image capture device 202 may be configured to capture images of at least a portion of the support surface 104 facing the image capture device 202. In some embodiments, and as shown in FIGS. 7A-7C, the image capture device 202 may be configured to view and capture an image of the entire support surface 104. As discussed in further detail below, the portion of the support surface 104 may include an alignment feature, such as alignment feature 702 shown in FIGS. 7A-7C, described in greater detail below.

In some embodiments, and as shown in FIG. 2, the image capture device 202 may include a camera (e.g., a digital camera) having a lens 204 with a calibration feature 206. In some embodiments, and as shown in FIG. 2, the calibration feature 206 may be a circle centered on the lens 204. In some embodiments, and as shown in FIG. 2, the calibration feature 206 may include one or more concentric circles on the lens 204. In some embodiments, where the image capture device 202 is a camera with lens 204, images captured using the lens 204 may include at least one calibration feature 206 (two are shown in FIG. 2), as well as the portion of the support surface 104 having an alignment feature.

In some embodiments, the image capture device 202 may include a projector 212 configured to project the calibration feature 206 onto a surface (e.g., the support surface 104) opposite the image capture device 202 so that the calibration feature 206 may be included in images captured by the image capture device 202. In some embodiments, the projector may include a light source (e.g., laser or LED) located behind the lens 204 to illuminate the calibration feature 206. Light from the light source on the lens may display an image of the calibration feature 206 on the support surface 104. The projector 212 may be configured and accurately positioned so that the projected image of the calibration feature 206 is centered with the lens 204.

In some embodiments, and as shown in FIGS. 2 and 4, the sensor substrate 110 may have a center ring 210 that is centered about axis A of the sensor substrate 110 and that can be aligned with a hole 402 of the robot blade 130. The hole 402 provides the image capture device 202 an unobstructed view of the support surface 104 when the sensor substrate 110 is supported and positioned by the robot blade 130 at the handoff position.

In some embodiments, and as shown in FIG. 1, the sensor substrate 110 may include a vibration sensor 140 for measuring vibration of the sensor substrate 110. In some embodiments, the vibration sensor may be a MEMS sensor. In some embodiments, the vibration sensor may be an optical sensor. In some embodiments, vibration measurements may be taken to measure vibration caused by a robot (not shown) moving the robot blade 130 and the sensor substrate 110. In some embodiments, vibration measurements at a certain time may be compared with previous vibration measurements for qualitative and/or quantitative comparison to determine an amount of wear on components (e.g., motors) of the robot to which the robot blade 130 is coupled. In some embodiments, vibrations exceeding a certain amount may indicate that repair or preventive maintenance of the robot is needed. In some embodiments, the sensor substrate 110 may be supported by lift pins (not shown) extending through the support surface 104 that are controlled by lift pin actuators (not shown). Vibration measurements obtained from the vibration sensor 140 while lift pin actuators are in operation may be compared with prior vibration measurements obtained for qualitative and/or quantitative comparison to determine an amount of wear on the lift pin actuators.

In some embodiments, and as shown in FIG. 1, the sensor substrate 110 may include a control module 150 on or in the body 112 connected to the first sensor 124 and the second sensor 126. The control module 150 may comprise circuitry for sensing a first distance (e.g., gap G1) between the first side 114 of the body 112 and a first surface (e.g., support surface 104) external to the sensor substrate 110 opposing the first side 114 using the first sensor 124 and comprise circuitry for sensing a second distance (e.g., gap G2) between the second side 116 of the body 112 and a second surface (e.g., the upper surface 108) external to the sensor substrate 110 opposing the second side 116 using the second sensor 126. In some embodiments, the control module 150 may be connected to the image capture device 202 and may include circuitry for acquiring images of the first surface (e.g., support surface 104). In some embodiments, the control module 150 may be connected to the vibration sensor 140 and may include circuitry for acquiring vibration measurements of the sensor substrate 110.

In some embodiments, the control module 150 may include one or more of a processor, a memory, and a wireless communication module (e.g., Bluetooth, WiFi, or the like). The inclusion of a wireless communication module may allow for data (e.g., distance measurement data, image data, vibration data) to be transferred to an external device that may control the positioning of the support surface 104 relative to the upper surface 108 and/or to an external device that may control the positioning of the robot blade 130.

In some embodiments, the control module 150 may include a power source (e.g., battery) for powering any of the circuitry, processor, memory, or wireless communication module of the control module 150 and at least one of the first sensor 124, second sensor 126, image capture device 202, or vibration sensor 140.

In some embodiments, the sensor substrate 110 may have substantially the same form-factor as substrates that are processed in the processing tool 100. For example, the sensor substrate 110 may have a diameter that is 300 mm. A sensor substrate 110 that has a form-factor that is substantially similar to the form-factor of the substrates may facilitate the calibration of the processing tool 100 without venting the processing chamber. For example, in some embodiments, the robot blade 130 and the sensor substrate 110 may fit through load locks (not shown) of the processing tool 100 to avoid vacuum breaks.

FIG. 5 shows a method 500 for measuring a gap between a support surface for a substrate and an opposing upper surface of a processing chamber in accordance with some embodiments of the present disclosure. At block 502, the method includes disposing a sensor substrate (e.g., sensor substrate 110) at a location spaced between a support surface (e.g., support surface 104) and an upper surface (e.g., upper surface 108) of a processing chamber (e.g., processing chamber 102). In some embodiments, and as shown in FIG.

1, upon disposing the sensor substrate 110 (e.g., at a handoff position of the robot blade 130), the first side 114 faces the support surface 104 and the second side 116 faces the upper surface 108.

At block 504, the method 500 may include measuring, using the first sensor (e.g., first sensor 124), a first distance (e.g., first gap G1) between the first side (e.g., first side 114) and the support surface (e.g., support surface 104). At block 506, the method 500 may include measuring, using the second sensor (e.g., second sensor 126), a second distance (e.g., second gap G2) between the second side (e.g., second side 116) and the upper surface (e.g., upper surface 108). At block 508, the method 500 may include determining a gap between the support surface (e.g., support surface 104) and the upper surface (e.g., upper surface 108) using the first distance (e.g., first gap G1) and the second distance (e.g., second gap G2). For example, as noted above, the thickness T of the body 112 may be known so that a total gap between the upper surface and the support surface may be obtained from the first gap G1, the second gap G2, and the thickness T.

In some embodiments, the method 500 may be performed while the sensor substrate (e.g., sensor substrate 110) is disposed in the processing chamber (e.g., processing chamber 102) and while the processing chamber is operating under substrate processing conditions of temperature and pressure. In some embodiments, the operating process temperature in the processing chamber 102 may be −20° C. to 450° C. for 15 s. In some embodiments, the operating process temperature in the processing chamber may be −20° C. to 650° C. In some embodiments, at least one of measuring the first distance (e.g., first gap G1) or measuring the second distance (e.g., second gap G2) is performed while the support surface is at a temperature of 100° C. or greater. In some embodiments, at least one of measuring the first distance (e.g., first gap G1) or measuring the second distance (e.g., second gap G2) is performed while the support surface is at a temperature of 200° C. or greater. In some embodiments, at least one of measuring the first distance (e.g., first gap G1) or measuring the second distance (e.g., second gap G2) is performed while the support surface is at a temperature of 300° C. or greater. In some embodiments, at least one of measuring the first distance (e.g., first gap G1) or measuring the second distance (e.g., second gap G2) is performed while the support surface is at a temperature of 400° C. or greater. In some embodiments, at least one of measuring the first distance (e.g., first gap G1) or measuring the second distance (e.g., second gap G2) is performed while the support surface is at a temperature of 500° C. or greater. In some embodiments, at least one of measuring the first distance (e.g., first gap G1) or measuring the second distance (e.g., second gap G2) is performed while the support surface is at a temperature of 600° C. or greater. In some embodiments, the operating process pressure in the processing chamber 102 may be ATM to 5E-9 Torr.

In some embodiments, at block 510, the method 500 may include measuring, using a plurality of first sensors (e.g., first sensors 124), a first plurality of distances between the first side (e.g., first side 114) and the support surface (e.g., support surface 104); measuring, using a plurality of second sensors (e.g., second sensors 126), a second plurality of distances between the second side (e.g., second side 116) and the upper surface (e.g., upper surface 108); and determining a parallelism measurement between the support surface and the upper surface based on the first plurality of distances and the second plurality of distances. In some embodiments, the first plurality of distances and the second plurality of distances may be measured substantially at the same time.

In some embodiments, and as shown in FIGS. 2 and 3, each of the first plurality of distances (e.g., gap G1) may be measured from locations on the first side 114 that are equidistantly spaced from a center of the sensor substrate 110, and each of the second plurality of distances (e.g., gap G2) may be measured from locations on the second side 116 that are equidistantly spaced from the center of the sensor substrate 110.

In some embodiments, at block 512, the method 500 may include adjusting the support surface (e.g., support surface 104) parallel to the upper surface (e.g., upper surface 108) based on the parallelism measurement.

In some embodiments, at block 514, the method 500 may include removing the sensor substrate (e.g., sensor substrate 110) from the processing chamber (e.g., processing chamber 102). In some embodiments, a wafer handling robot may be used to control the robot blade 130 to remove the sensor substrate 110 from the processing chamber 102. In some embodiments, the sensor substrate 110 may be removed without venting the processing chamber or otherwise altering the process conditions (e.g., temperature and pressure). Thus, the processing chamber 102 may be calibrated (i.e., adjusted to provide a desired gap and parallelism between the upper surface and the support surface) without altering the process conditions in order to begin processing substrates.

Figure 6:
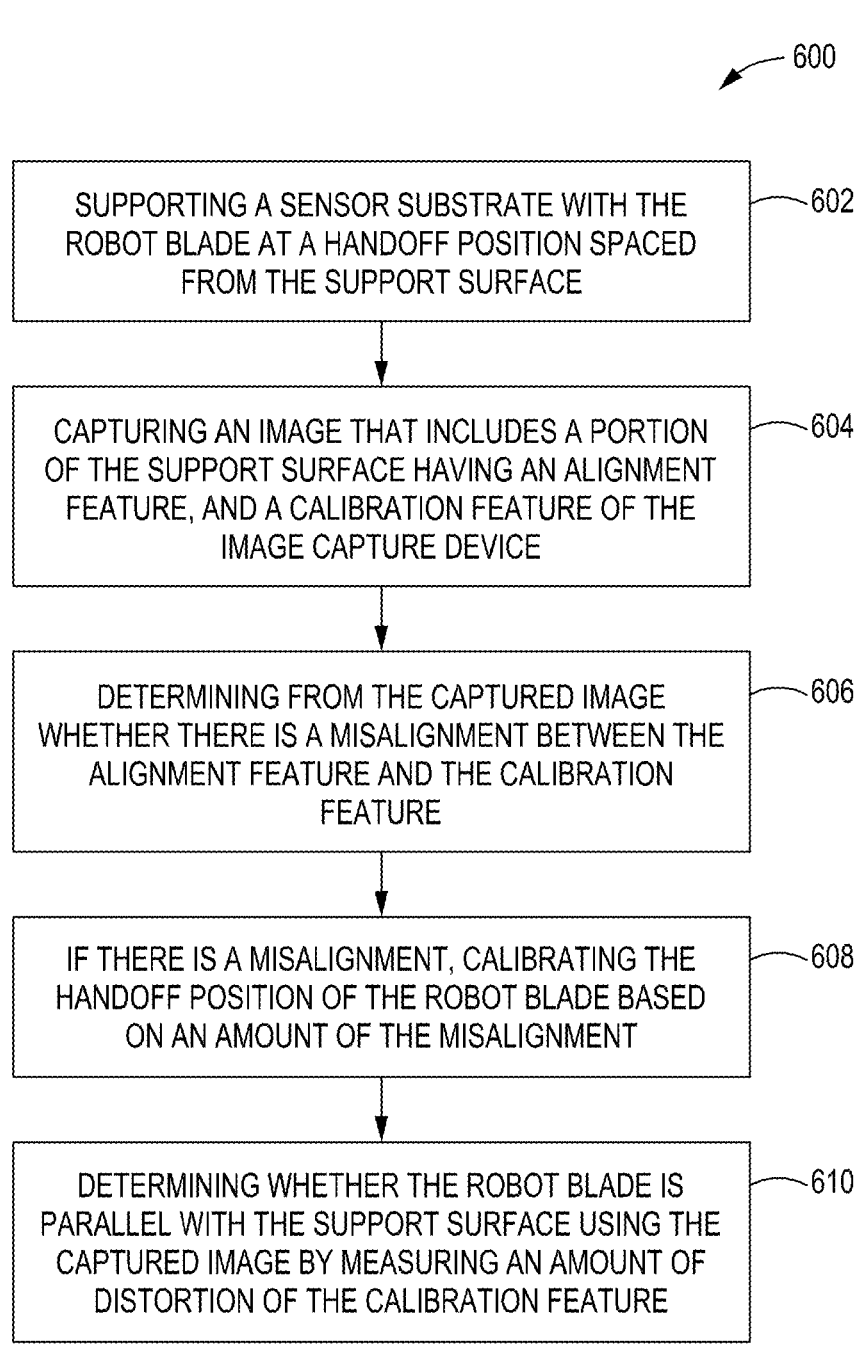
FIG. 6 shows a method in accordance with some embodiments of the present disclosure.

FIG. 6 shows a method 600 for calibrating a robot blade in a processing chamber having a support surface for a substrate, in accordance with embodiments of the present disclosure. At block 602, the method 600 may include supporting a sensor substrate (e.g., sensor substrate 110) with a robot blade (e.g., robot blade 130) at a handoff position spaced from a support surface (e.g., support surface 104). In some embodiments, and as shown in FIGS. 2 and 4, the sensor substrate 110 may have an image capture device 202 at a center of the sensor substrate 110. In some embodiments, at block 604, the method 600 may include capturing an image that includes a portion of the support surface having an alignment feature, and a calibration feature (e.g., calibration feature 206) of the image capture device. In some embodiments, and as shown in FIGS. 7A-7C, the entire support surface 104 may be captured by the image capturing device. In some embodiments, and as shown in FIGS. 7A-7C, the support surface 104 has an alignment feature 702 shown as a center hole of the support surface 104 and the calibration feature 206 may be shown in the captured image with the alignment feature 702.

In some embodiments, and at block 606, the method 600 may include determining from the captured image whether there is a misalignment between the alignment feature and the calibration feature. For example, in the captured image shown in FIG. 7A, the alignment feature 702 is a central hole of the support surface 104 and the alignment features 702 is centered within the calibration feature 206, which is shown as a circle surrounding the central hole. Thus, a determination may be made that the alignment feature 702 and the calibration feature 206 in FIG. 7A are aligned. In the captured image shown in FIG. 7B, the alignment feature 702 is not centered with the calibration feature 206 and, thus, a determination may be made that there is a misalignment between the alignment feature 702 and the calibration feature 206 in FIG. 7B.

In some embodiments, and at block 608, if there is a misalignment between the alignment feature and the calibration feature, the method 600 may include calibrating the handoff position of the robot blade (e.g., robot blade 130) based on an amount of the misalignment. In some embodiments, the method 600 may include measuring the amount of the misalignment between the alignment feature and the calibration feature as an offset distance between the alignment feature and the center of the calibration feature. In some embodiments, using the captured image, distance measurements along two orthogonal axes may be made between the center of the alignment feature and the center of the calibration feature and the orthogonal distance measurements may be used to adjust the robot blade in the handoff position.

In some embodiments, at block 610, the method 600 may include determining whether the robot blade (e.g., robot blade 130) is parallel with the support surface (e.g., support surface 104) using the captured image by measuring an amount of distortion of the calibration feature (e.g., calibration feature 206). For example, FIG. 7C shows the circular calibration feature 206 in FIGS. 7A and 7B distorted as an ellipse, indicating that the robot blade 130 is not parallel to the support surface 104 (e.g., the robot blade 130 has drooped). In some embodiments, the amount of distortion may be determined by measuring a dimensional change of the calibration feature 206. In some embodiments, at least one of the major axis or minor axis of the ellipse shown in FIG. 7C may be compared to the dimension (e.g. diameter) of the undistorted calibration feature 206 to determine an angle of droop of the robot blade 130. In some embodiments, a lookup table or mathematical formula may be used to correlate dimensional changes of the calibration feature 206 to the angle between the robot blade 130 and the support surface 104.

Figure 8A:
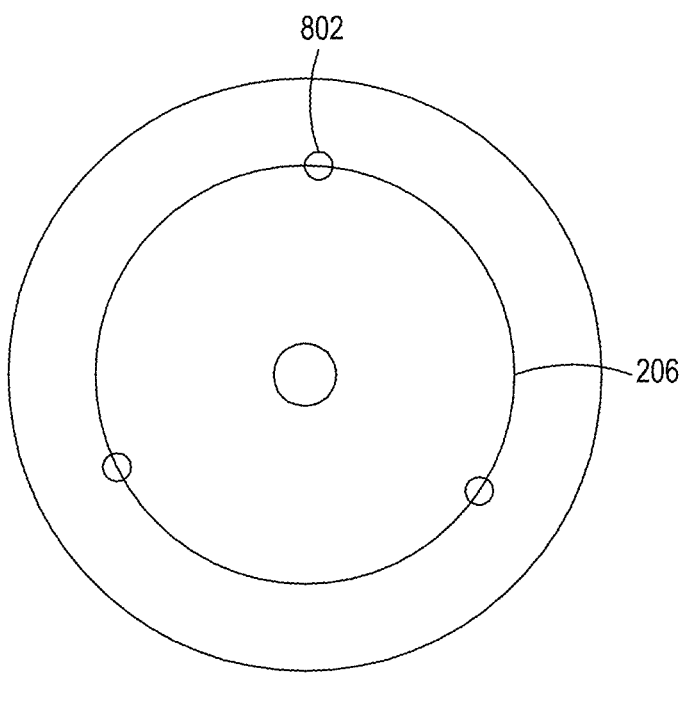
FIGS. 8A and 8B show images captured by an image capture device of a sensor substrate in accordance with embodiments of the present disclosure.
Figure 8B:
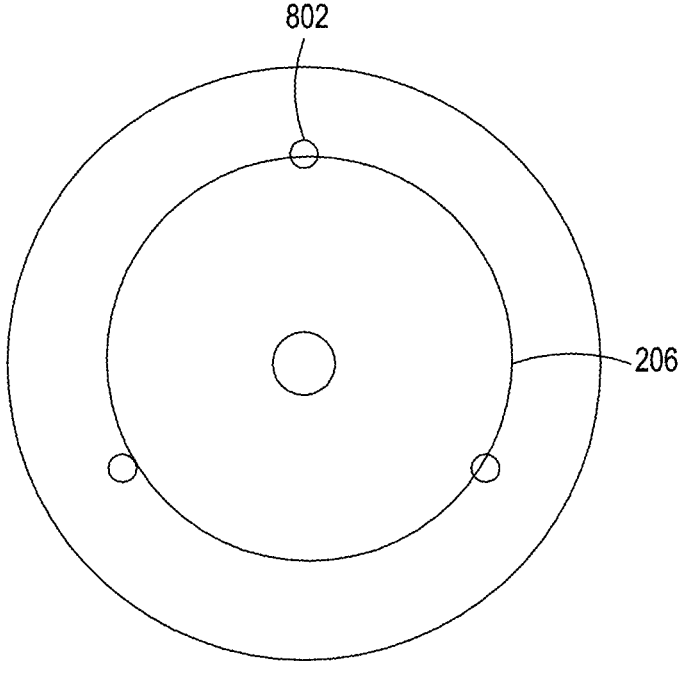

In some embodiments, and as shown in FIGS. 8A and 8B, the portion of the support surface 104 that is captured by the image capture device 202 may include a plurality of alignment features, such as lift pins or lift pin holes. In some embodiments, a plurality of gas (e.g., backside cooling) holes may be used as alignment features. In FIG. 8A, the calibration feature 206 is shown as a circle and the alignment features 802 include a plurality of lift pin holes that are aligned with the circle, indicating that the calibration feature 206 and the alignment features 802 are aligned. In FIG. 8B, the calibration feature 206 is shown as a circle that is not aligned with the three lift pin holes, indicating that the calibration feature 206 is not aligned with the alignment features 802.

Figure 9:
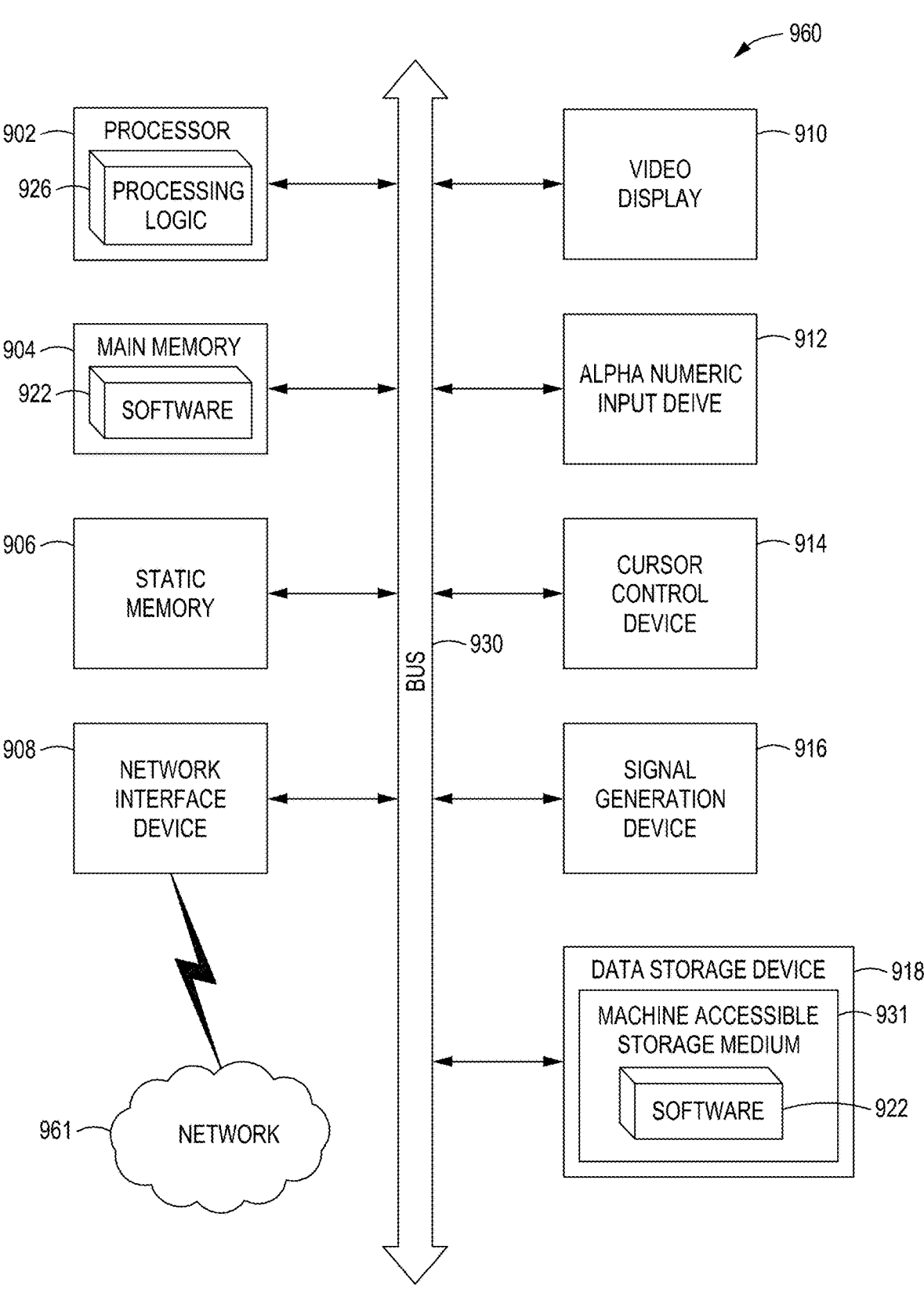
FIG. 9 shows a block diagram of an exemplary computer system that may be used in conjunction with some embodiments of the present disclosure.

Referring now to FIG. 9, a block diagram of an exemplary computer system 660 of a processing tool is illustrated in accordance with an embodiment. In an embodiment, computer system 960 is coupled to and controls processing in the processing tool and/or calibration measurements of the processing tool with a sensor substrate. Computer system 960 may be connected (e.g., networked) to other machines in a network 961 (e.g., a Local Area Network (LAN), an intranet, an extranet, or the Internet). Computer system 960 may operate in the capacity of a server or a client machine in a client-server network environment, or as a peer machine in a peer-to-peer (or distributed) network environment. Computer system 960 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated for computer system 960, the term "machine" shall also be taken to include any collection of machines (e.g., computers) that individually or jointly execute a set (or multiple sets) of instructions to perform any one or more of the methodologies described herein.

Computer system 960 may include a computer program product, or software 922, having a non-transitory machine-readable medium having stored thereon instructions, which may be used to program computer system 960 (or other electronic devices) to perform a process according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

In an embodiment, computer system 960 includes a system processor 902, a main memory 904 (e.g., read-only memory (ROM), flash memory, dynamic random access memory (DRAM) such as synchronous DRAM (SDRAM) or Rambus DRAM (RDRAM), etc.), a static memory 906 (e.g., flash memory, static random access memory (SRAM), etc.), and a secondary memory 918 (e.g., a data storage device), which communicate with each other via a bus 930.

System processor 902 represents one or more general-purpose processing devices such as a microsystem processor, central processing unit, or the like. More particularly, the system processor may be a complex instruction set computing (CISC) microsystem processor, reduced instruction set computing (RISC) microsystem processor, very long instruction word (VLIW) microsystem processor, a system processor implementing other instruction sets, or system processors implementing a combination of instruction sets. System processor 902 may also be one or more special-purpose processing devices such as an application specific integrated circuit (ASIC), a field programmable gate array (FPGA), a digital signal system processor (DSP), network system processor, or the like. System processor 902 is configured to execute the processing logic 926 for performing the operations described herein.

The computer system 960 may further include a system network interface device 908 for communicating with other devices or machines. The computer system 960 may also include a video display unit 910 (e.g., a liquid crystal display (LCD), a light emitting diode display (LED), or a cathode ray tube (CRT)), an alphanumeric input device 912 (e.g., a keyboard), a cursor control device 914 (e.g., a mouse), and a signal generation device 916 (e.g., a speaker).

The secondary memory 918 may include a machine-accessible storage medium 931 (or more specifically a computer-readable storage medium) on which is stored one or more sets of instructions (e.g., software 922) embodying any one or more of the methodologies or functions described herein. The software 922 may also reside, completely or at least partially, within the main memory 904 and/or within the system processor 902 during execution thereof by the computer system 960, the main memory 904 and the system processor 902 also constituting machine-readable storage media. The software 922 may further be transmitted or received over a network 961 via the system network interface device 908.

While the machine-accessible storage medium 931 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies. The term "machine-readable storage medium" shall accordingly be taken to include, but not be limited to, solid-state memories, and optical and magnetic media.

Embodiments described herein provide for in-situ gap measurements and parallelism measurements between a support surface and an opposing upper surface in a processing chamber of a processing tool. By providing a sensor substrate that can take measurements at substrate process conditions, accuracy of calibrations can be improved and downtime of the processing tool due to calibration can be reduced, thereby increasing throughput. Moreover, as the accuracy of calibrations is improved, the uniformity of substrate processing can also be improved, further reducing rework and improving yield.

While the foregoing is directed to embodiments of the present disclosure, other and further embodiments of the disclosure may be devised without departing from the basic scope thereof.

The invention claimed is:

1. A method for measuring a gap between a support surface for a substrate and an opposing upper surface of a processing chamber, the method comprising:
   disposing a sensor substrate at a location spaced between the support surface and the upper surface, the sensor substrate comprising a body having a first side and a second side opposite the first side, the first side facing the support surface and the second side facing the upper surface, the first side having a first sensor and the second side having a second sensor;
   measuring, using the first sensor, a first distance between the first side and the support surface;
   measuring, using the second sensor, a second distance between the second side and the upper surface; and
   determining a gap between the support surface and the upper surface using the first distance and the second distance,
   wherein the sensor substrate is disposed in the processing chamber while the processing chamber is operating under substrate processing conditions of temperature and pressure.

2. The method according to claim 1, wherein the first sensor is located less than 600 mm from the support surface and the second sensor is located less than 600 mm from the upper surface.

3. The method according to claim 1, wherein the first side includes a plurality of first sensors and the second side includes a plurality of second sensors and the method includes:
   measuring, using the plurality of first sensors, a first plurality of distances between the first side and the support surface;
   measuring, using the plurality of second sensors, a second plurality of distances between the second side and the upper surface; and
   determining whether the support surface and the upper surface are parallel based on the first plurality of distances and the second plurality of distances.

4. The method according to claim 3, wherein each of the first plurality of distances are measured from locations on the first side that are equidistantly spaced from a center of the sensor substrate, and wherein each of the second plurality of distances are measured from locations on the second side that are equidistantly spaced from the center of the sensor substrate.

5. The method of claim 1, further comprising:
   supporting the sensor substrate with a robot blade at a handoff position spaced from the support surface, the sensor substrate having an image capture device at a center of the sensor substrate;
   capturing an image that includes a portion of the support surface having an alignment feature, and a calibration feature of the image capture device;
   determining from the captured image whether there is a misalignment between the alignment feature and the calibration feature; and
   calibrating the handoff position of the robot blade based on an amount of the determined misalignment.

6. The method according to claim 5, determining whether the robot blade is parallel with the support surface using the captured image by measuring an amount of distortion of the calibration feature.

7. The method according to claim 5, measuring the amount of the misalignment as an offset distance between the alignment feature and the center of the calibration feature.

8. The method according to claim 5, wherein the portion of the support surface includes a plurality of alignment features.

9. The method according to claim 5, wherein the alignment feature includes at least one of a center of the support surface or a lift pin hole.

10. A method for measuring a gap between a support surface for a substrate and an opposing upper surface of a processing chamber, the method comprising:
   disposing a sensor substrate at a location spaced between the support surface and the upper surface, the sensor substrate comprising a body having a first side and a second side opposite the first side, the first side facing the support surface and the second side facing the upper surface, the first side having a first sensor and the second side having a second sensor;
   measuring, using the first sensor, a first distance between the first side and the support surface;
   measuring, using the second sensor, a second distance between the second side and the upper surface; and
   determining a gap between the support surface and the upper surface using the first distance and the second distance,
   wherein at least one of measuring the first distance or measuring the second distance is performed while the support surface is at a temperature of 100 degrees C. or greater.

11. The method according to claim 10, wherein the first sensor is located less than 600 mm from the support surface and the second sensor is located less than 600 mm from the upper surface.

12. The method according to claim 10, wherein the first side includes a plurality of first sensors and the second side includes a plurality of second sensors and the method includes:
   measuring, using the plurality of first sensors, a first plurality of distances between the first side and the support surface;

measuring, using the plurality of second sensors, a second plurality of distances between the second side and the upper surface; and determining whether the support surface and the upper surface are parallel based on the first plurality of 5 distances and the second plurality of distances.

13. The method according to claim 12, wherein each of the first plurality of distances are measured from locations on the first side that are equidistantly spaced from a center of the sensor substrate, and wherein each of the second 10 plurality of distances are measured from locations on the second side that are equidistantly spaced from the center of the sensor substrate.

\* \* \* \* \*